(12) United States Patent
Jhang et al.

(10) Patent No.: US 8,530,144 B2
(45) Date of Patent: Sep. 10, 2013

(54) PHOTOMASK AND METHOD FOR FABRICATING SOURCE/DRAIN ELECTRODE OF THIN FILM TRANSISTOR

(75) Inventors: Zong-Long Jhang, Hsinchu (TW);
Chia-Ming Chang, Hsinchu (TW);
Hsiang-Chih Hsiao, Hsinchu (TW);
Chun-Yi Chiang, Hsinchu (TW);
Che-Yung Lai, Hsinchu (TW);
Chou-Huan Yu, Hsinchu (TW); Ta-Wen Liao, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 65 days.

(21) Appl. No.: 13/415,478

(22) Filed: Mar. 8, 2012

(65) Prior Publication Data

US 2012/0270397 A1 Oct. 25, 2012

Related U.S. Application Data (62) Division of application No. 12/629,985, filed on Dec. 3, 2009, now Pat. No. 8,153,337.

(30) Foreign Application Priority Data

Aug. 31, 2009 (TW) .................... 98129226 A (51) Int. Cl.
*H01L 21/00* (2006.01)
(52) U.S. Cl.
USPC .......................................... 430/311; 438/149

(58) Field of Classification Search
USPC ...................... 430/5, 311, 312, 313; 438/666
See application file for complete search history.

(56) References Cited

U.S. PATENT DOCUMENTS

| | | | |
|---|---|---|---|
| 6,255,130 B1 | 7/2001 | Kim | |
| 6,653,028 B2 | 11/2003 | Lee | |
| 7,871,743 B2 | 1/2011 | Dong et al. | |
| 2006/0051974 A1 | 3/2006 | French | |
| 2007/0109455 A1 | 5/2007 | Kim et al. | |
| 2008/0107972 A1 | 5/2008 | Yamayoshi | |
| 2009/0068571 A1 | 3/2009 | Dong et al. | |

OTHER PUBLICATIONS

Taiwanese language office action dated Nov. 12, 2012.

*Primary Examiner* — Stephen Rosasco
(74) *Attorney, Agent, or Firm* — McClure, Qualey & Rodack, LLP (57) ABSTRACT

A method is provided for fabricating source/drain electrodes of a thin film transistor. The method generally provides a substrate having a first gate electrode and a second gate electrode adjacent and electrically connected. The method further provides coating a photoresist layer on the metal layer, and performing an exposure process on the photoresist layer by a photomask. The method further performs a development process on the exposed photoresist layer to form a photoresist pattern layer with different thicknesses on the metal layer, and then etches the metal layer using the photoresist pattern layer as an etch mask, to form a pair of first source/drain electrodes on the first gate electrode and a pair of second source/drain electrodes on the second gate electrode.

17 Claims, 8 Drawing Sheets

PHOTOMASK AND METHOD FOR FABRICATING SOURCE/DRAIN ELECTRODE OF THIN FILM TRANSISTOR

CROSS REFERENCE

This application is a Divisional of application Ser. No. 12/629,985, filed Dec. 3, 2009, which claims the benefit of Taiwanese application Serial No. 98129226 filed Aug. 31, 2009, the subject matter of which is incorporated herein by reference.

BACKGROUND OF THE DISCLOSURE

1. Field of the Disclosure

The disclosure relates to semiconductor technology and more particularly to a photomask for fabrication of a thin film transistor (TFT) in a flat panel display (FPD) device.

2. Description of the Related Art

Due to the advantages of a thin profile and low power consumption, liquid crystal displays (LCDs) are widely employed in electronic products, such as portable personal computers, digital cameras, projectors and the like. Typically, such an LCD includes a color filter (CF) substrate, an array substrate, and a liquid crystal layer interposed therebetween, in which each pixel of the array substrate includes TFT circuits.

Typically, photolithography and etching processes are used for the fabrication of the TFT circuits in the array substrate. Different photomasks are needed for each photolithography process. Accordingly, photomasks of 5 to 6 sheets are required for fabrication of the conventional TFT array substrate. Since the photolithography process is expensive and multiple photomasks further increase the manufacturing cost of TFTs, it is desirable to reduce the number of photomasks used for fabricating TFTs.

In order to reduce the number of photomasks used for fabricating TFTs, a proposed approach is to use a single photomask for different etching processes. Namely, a photoresist with different thicknesses may be provided for different etching processes. In the conventional photolithography process, utilization of a halftone mask (HTM) is one of the methods for forming photoresist with different thicknesses. The halftone mask includes a translucent film with different exposure degrees for different regions of a photoresist, such that the photoresist can be formed with different thicknesses.

However, although the number of photomasks used for fabricating TFTs is reduced, process stability using halftone masks is lower than that of binary masks, and thus TFT fabrication yield is reduced. Therefore, there is a need to design a novel halftone mask capable of increasing TFT fabrication yield or maintaining TFT fabrication yield.

BRIEF SUMMARY OF THE INVENTION

A detailed description is given in the following embodiments with reference to the accompanying drawings. Photomasks for fabricating a TFT and methods for fabricating source/drain electrodes of TFT are provided.

An embodiment of a photomask for fabricating a TFT comprises a transparent substrate having a U-shaped channel-forming region and a rectangular channel-forming region adjacent thereto. A translucent layer is disposed on the transparent substrate and covers the U-shaped and rectangular channel-forming regions. First and second light-shielding layers are disposed on the translucent layer and located at the outer and inner sides of the U-shaped channel-forming region, respectively, to serve as a pair of first source/drain-forming regions. Third and fourth light-shielding layers are disposed on the translucent layer and located at opposite sides of the rectangular channel-forming region, respectively, to serve as a pair of second source/drain-forming regions. An end of the third light-shielding layer extends to the first light-shielding layer. A plurality of first light-shielding islands is disposed on the translucent layer and located within the rectangular channel-forming region.

Another embodiment of a photomask for fabricating a TFT comprises a transparent substrate having a U-shaped channel-forming region and a rectangular channel-forming region adjacent thereto. A translucent layer is disposed on the transparent substrate, covers the rectangular channel-forming region, and exposes the U-shaped rectangular channel-forming region, in which the translucent layer has a transmittance of about 30% to 35%. A first light-shielding layer and a second light-shielding layer are disposed on the translucent layer and located at the outer and inner sides of the U-shaped channel-forming region, respectively, to serve as a pair of first source/drain-forming regions, in which a space between the first and second light-shielding layers is the same as a width of the U-shaped channel-forming region, and the space is about 1.7 μm to 2.5 μm. A third light-shielding layer and a fourth light-shielding layer are disposed on the translucent layer and located at opposite sides of the rectangular channel-forming region, respectively, to serve as a pair of second source/drain-forming regions, in which an end of the third light-shielding layer extends to the first light-shielding layer.

An embodiment of a method for fabricating source/drain electrodes of a TFT comprises providing a substrate having a first gate electrode and a second gate electrode adjacent and electrically connected thereto, in which the first and second gate electrodes are successively covered by a gate dielectric layer, a semiconductor layer, and a metal layer. A photoresist layer is coated on the metal layer. An exposure process is performed on the photoresist layer by a photomask. The photomask comprises a transparent substrate having a U-shaped channel-forming region and a rectangular channel-forming region corresponding to the first and second gate electrodes, respectively. A translucent layer is disposed on the transparent substrate and covers the U-shaped and rectangular channel-forming regions. A first light-shielding layer and a second light-shielding layer are disposed on the translucent layer and located at the outer and inner sides of the U-shaped channel-forming region, respectively, to serve as a pair of first source/drain-forming regions. A third light-shielding layer and a fourth light-shielding layer are disposed on the translucent layer and located at opposite sides of the rectangular channel-forming region, respectively, to serve as a pair of second source/drain-forming regions, in which an end of the third light-shielding layer extends to the first light-shielding layer. A plurality of first light-shielding islands is disposed on the translucent layer and located within the rectangular channel-forming region. A development process is performed on the exposed photoresist layer to form a photoresist pattern layer with different thicknesses on the metal layer, in which the photoresist pattern layer corresponding to the U-shaped and rectangular channel-forming regions has a thickness less than that of the photoresist pattern layer corresponding to the pairs of first and second source/drain-forming regions. The metal layer is etched using the photoresist pattern layer as an etch mask, to form a pair of first source/drain electrodes on the first gate electrode and a pair of second source/drain electrodes on the second gate electrode.

Another embodiment of a method for fabricating source/drain electrodes of a TFT comprises providing a substrate having a first gate electrode and a second gate electrode adjacent and electrically connected thereto, in which the first and second gate electrodes are successively covered by a gate dielectric layer, a semiconductor layer, and a metal layer. A photoresist layer is coated on the metal layer. An exposure process is performed on the photoresist layer by a photomask. The photomask comprises a transparent substrate having a U-shaped channel-forming region and a rectangular channel-forming region corresponding to the first and second gate electrodes, respectively. A translucent layer is disposed on the transparent substrate, covers the rectangular channel-forming region, and exposes the U-shaped rectangular channel-forming region, in which the translucent layer has a transmittance of about 30% to 35%. A first light-shielding layer and a second light-shielding layer are disposed on the translucent layer and located at the outer and inner sides of the U-shaped channel-forming region, respectively, to serve as a pair of first source/drain-forming regions, in which a space between the first and second light-shielding layers is the same as a width of the U-shaped channel-forming region, and the space is about 1.7 μm to 2.5 μm. A third light-shielding layer and a fourth light-shielding layer are disposed on the translucent layer and located at opposite sides of the rectangular channel-forming region, respectively, to serve as a pair of second source/drain-forming regions, in which an end of the third light-shielding layer extends to the first light-shielding layer.

BRIEF DESCRIPTION OF DRAWINGS

The disclosure can be more fully understood by reading the subsequent detailed description and examples with references made to the accompanying drawings, wherein.

DETAILED DESCRIPTION OF DISCLOSURE

The following description is of the best-contemplated mode of carrying out the disclosure. This description is provided for the purpose of illustrating the general principles of the disclosure and should not be taken in a limiting sense. The scope of the disclosure is best determined by reference to the appended claims.

Figure 1A:
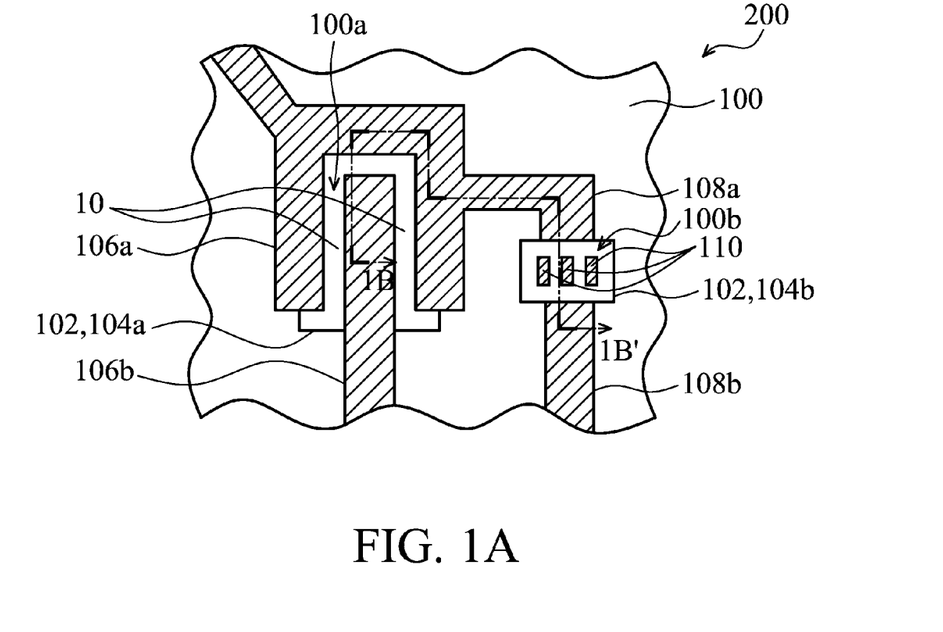
FIG. 1A is a plan view of an embodiment of a photomask according to the disclosure.
Figure 1B:
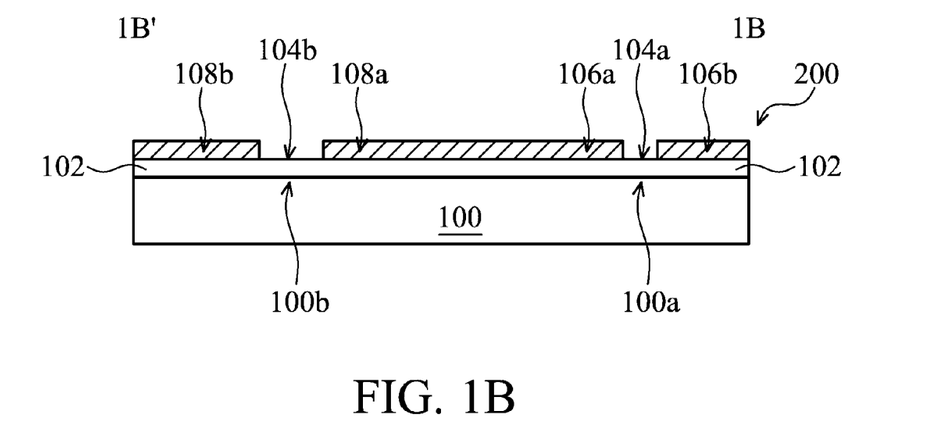
FIG. 1B is a cross section along the line 1B-1B' shown in FIG. 1A.

FIGS. 1A and 1B illustrate an embodiment of a photomask according to the disclosure, in which FIG. 1B is a cross section along the line 1B-1B' shown in FIG. 1A. In the embodiment, the photomask 200 may be used for fabrication of TFTs and comprise a transparent substrate 100, a translucent layer 102, a plurality of light-shielding layers 106a, 106b, 108a, and 108b, and a plurality of light-shielding islands 110 (not shown in FIG. 1B). The transparent substrate 100, such as glass, quartz, or plastic, has a U-shaped channel-forming region 100a and a rectangular channel-forming region 100b. The rectangular channel-forming region 100b is adjacent to the U-shaped channel-forming region 100a. For example, the rectangular channel-forming region 100b is adjacent to one of a pair of long edges of the U-shaped channel-forming region 100a.

The translucent layer 102 is disposed on the transparent substrate 100. In the embodiment, the translucent layer 102 has a first portion 104a covering the U-shaped channel-forming region 100a and a second portion 104b covering the rectangular channel-forming region 100b.

The light-shielding layers 106a and 106b are disposed on the translucent layer 102 and respectively located at outer and inner sides of the U-shaped channel-forming region 100a. Namely, the U-shaped channel-forming region 100a is interposed between the light-shielding layers 106a and 106b. The light-shielding layers 106a and 106b serve as a pair of source/drain-forming regions corresponding to the U-shaped channel-forming region 100a. The light-shielding layers 106a and 106b may comprise chromium or other opaque light-shielding material well known in the art. Moreover, in one embodiment, the light-shielding layer 106a located at outer side of the U-shaped channel-forming region 100a has a U-shaped profile from a top view, and the light-shielding layer 106b located at inner side of the U-shaped channel-forming region 100a has a bar-shaped profile from a top view.

The light-shielding layers 108a and 108b are also disposed on the translucent layer 102, and respectively located at opposite sides of the rectangular channel-forming region 100b, such that the rectangular channel-forming region 100b is interposed between the light-shielding layers 108a and 108b to serve as a pair of source/drain-forming regions corresponding to the rectangular channel-forming region 100b. The light-shielding layers 108a and 108b may also comprise chromium or other opaque light-shielding material well known in the art. Moreover, in one embodiment, the light-shielding layers 108a and 108b have a bar-shaped profile from a top view, in which an end of the light-shielding layer 108a extends to the light-shielding layer 106a for connecting thereto. For example, an end of the light-shielding layer 108a laterally extends to one of a pair of long edges 10 of the U-shaped light-shielding layer 106a.

Since difference in occupied area between the rectangular channel-forming region 100b and the U-shaped channel-forming region 100a results in different exposure degrees of both regions, a photoresist layer corresponding to both regions has different thicknesses after definition thereof, thereby causing undesirable effects for subsequent process steps. For example, the expose degree of the rectangular channel-forming region 100b with a relatively larger occupied area is greater than that under the U-shaped channel-forming region 100a with a relatively smaller occupied area, such that the thickness of the photoresist layer corresponding to the rectangular channel-forming region 100b is less than that of the photoresist layer corresponding to the U-shaped channel-forming region 100a. Accordingly, in the embodiment, in particular, the plurality of light-shielding islands 110 are disposed on the translucent layer 102 and located within the rectangular channel-forming region 100b. The plurality of light-shielding islands 110 may relatively reduce the exposure degree of the rectangular channel-forming region 100b, such that the exposure degree of the rectangular channel-forming region 100b is substantially the same as that of the U-shaped channel-forming region 100a. The plurality of light-shielding islands 110 may also comprise chromium or other opaque light-shielding material well known in the art.

FIGS. 2A to 2D illustrates various embodiments of the arrangement of the plurality of light-shield islands 110.

Figure 2A:
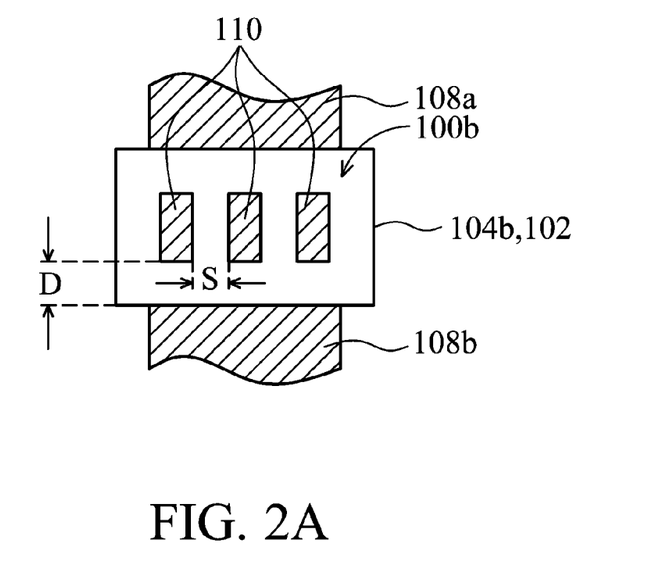
FIGS. 2A to 2D are plan views of various embodiments of the arrangement of light-shielding islands.

Referring to FIG. 2A, each of the plurality of light-shield islands 110 may be rectangular from a top view, and the plurality of light-shield islands 110 is arranged in parallel with a predetermined space S and along the extending direction of the short side of the rectangular light-shield island 110. The arrangement direction is perpendicular to the extending direction of the light-shielding layers 108a and 108b. Note that the number of the plurality of light-shield islands 110 is based on design requirements and is not limited to three as shown in FIG. 2A. In one embodiment, there is a predetermined distance D between each light-shield island 110 and the light-shielding 108a or 108b, which is about of 2.5 μm to 3.5 μm. Moreover, the predetermined space S between the plurality of light-shield islands 110 is about of 2.0 μm to 2.5 μm, such that the ratio of the predetermined distance D to the predetermined space S is about 1.25 to 1.5. In addition, the width of the short side of the rectangular light-shield island 110 is about 0.7 μm to 1.0 μm.

Figure 2B:
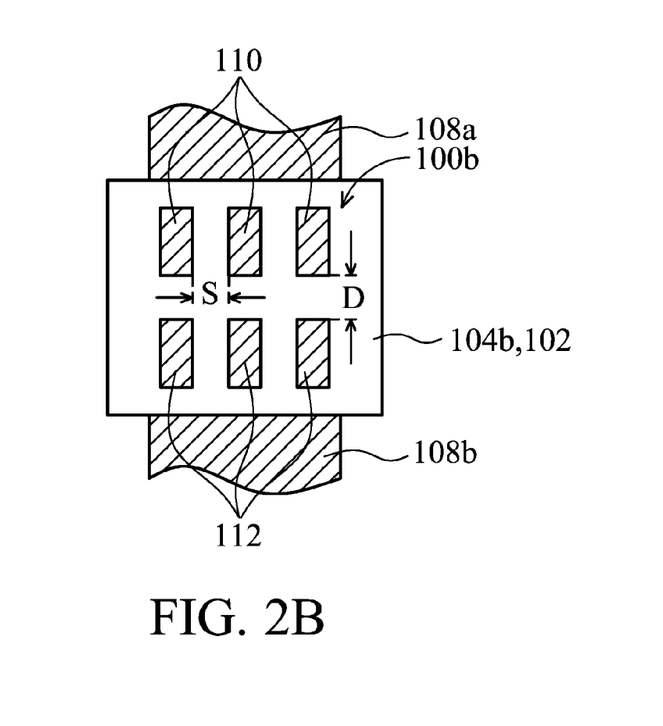

Referring to FIG. 2B, in this embodiment, a plurality of light-shield islands 112 are disposed on the second portion 104b of the translucent layer 102 and located within the rectangular channel-forming region 100b in addition to the arrangement of the plurality of light-shield islands 110 as shown in FIG. 2A. The plurality of light-shield islands 112 has the same profile from a top view and the same arrangement as the plurality of light-shield islands 110, and the plurality of light-shield islands 112 is juxtaposed with the plurality of light-shield islands 110. The arrangement direction of the pluralities of light-shield islands 112 and 110 is the same as the extending direction of the light-shielding layers 108a and 108b, in which the distance between the plurality of light-shield islands 112 and the plurality of light-shield islands 110 may be the same as the predetermined distance D between the plurality of light-shield islands 110 and the light-shielding layer 108a or 108b. In this embodiment, two rows of light-shield islands 110 and 112 are disposed within the rectangular channel-forming region 100b. In some embodiments, however, more than two rows of light-shield islands may be disposed within the rectangular channel-forming region 100b.

Figure 2C:
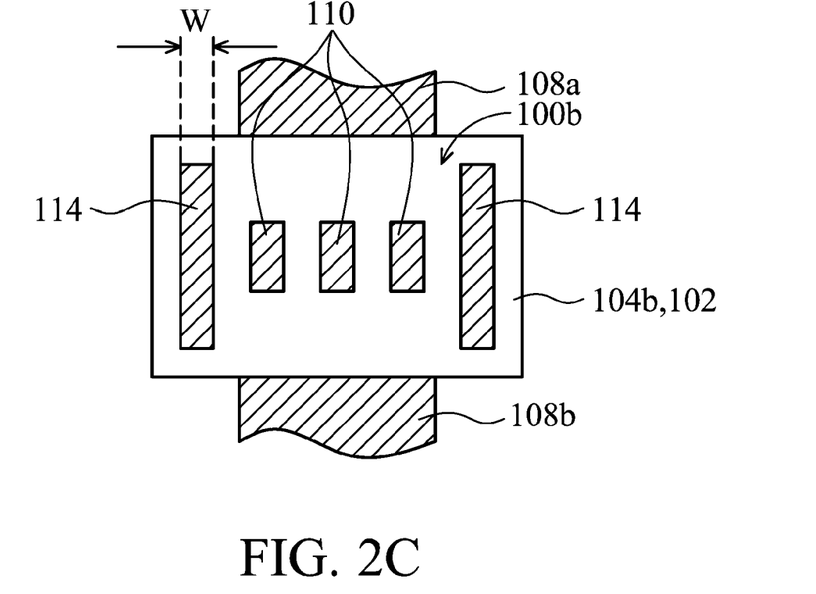

Referring to FIG. 2C, in this embodiment, a pair of light-shield islands 114 is disposed on the second portion 104b of the translucent layer 102, located within the rectangular channel-forming region 100b and at opposite sides thereof in addition to the arrangement of the plurality of light-shield islands 110 as shown in FIG. 2A, such that the plurality of light-shielding islands 110 is located between the pair of third light-shielding islands 114, and the pair of light-shielding islands 114 is arranged in parallel with the plurality of light-shielding islands 110 by a predetermined space S. In this embodiment, the pair of light-shielding islands 114 has a rectangular profile from a top view. Moreover, each light-shielding island 114 has a width of about 0.7 μm to 1.0 μm and has a length greater than that of each light-shielding island 110.

Figure 2D:
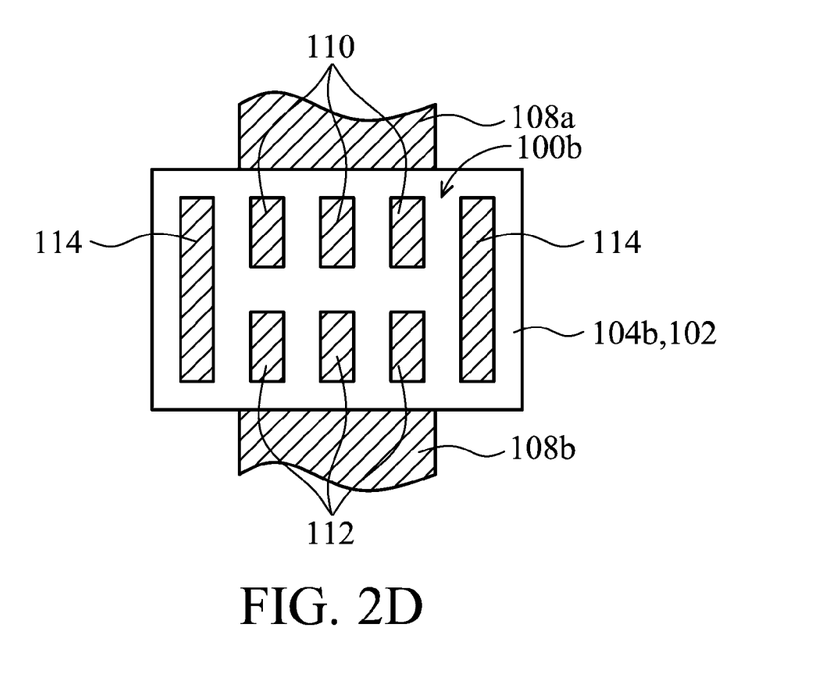

Referring to FIG. 2D, in this embodiment, a pair of light-shield islands 114 is disposed on the second portion 104b of the translucent layer 102, located within the rectangular channel-forming region 100b and at opposite sides thereof in addition to the arrangement of the pluralities of light-shield islands 110 and 112 as shown in FIG. 2B, such that the pluralities of light-shield islands 110 and 112 are located between the pair of third light-shielding islands 114, and the pair of light-shielding islands 114 is arranged in parallel with the plurality of light-shielding islands 110 by a predetermined space S.

Figure 4A:
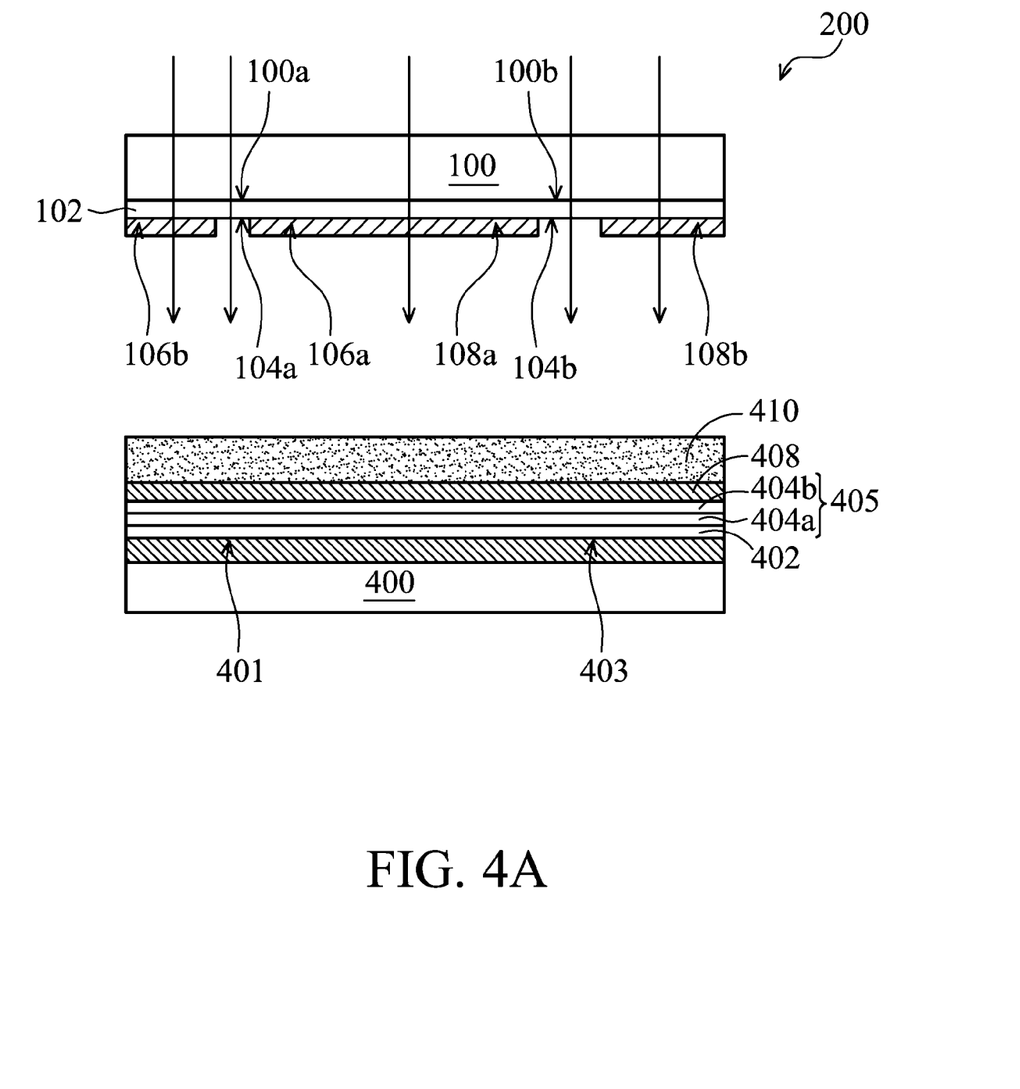
FIGS. 4A to 4C are cross sections of an embodiment of a method for fabricating source/drain electrodes of a TFT according to the disclosure.
Figure 4B:
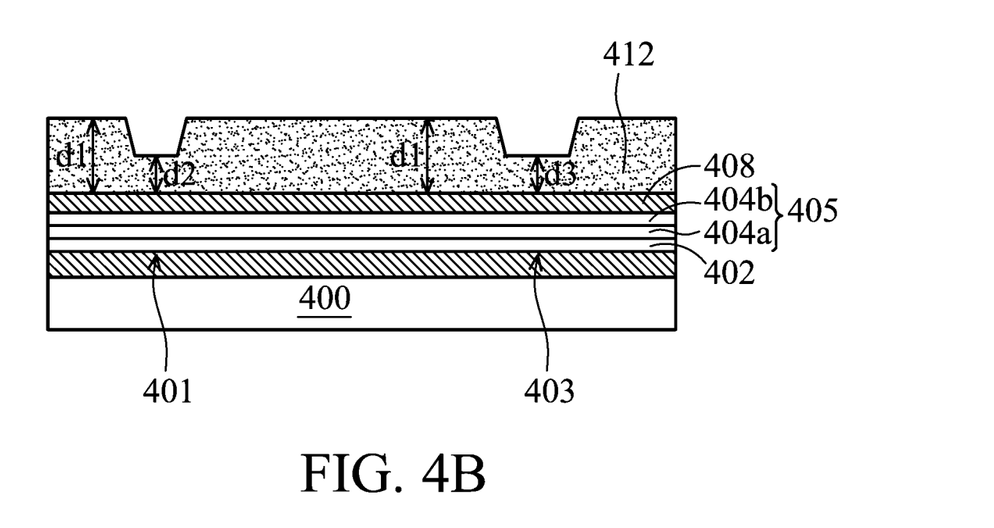
Figure 4C:
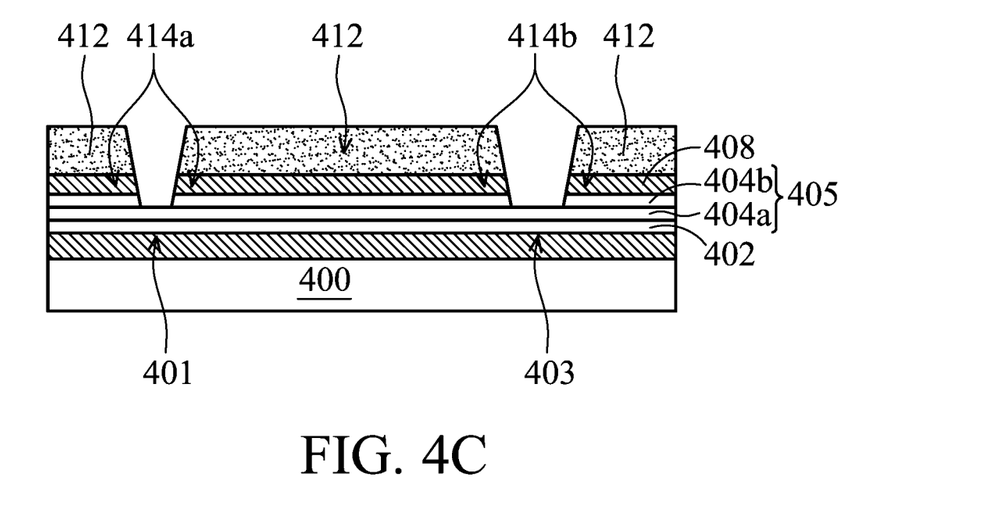

FIGS. 4A to 4C are cross sections of an embodiment of a method for fabricating source/drain electrodes of a TFT according to the disclosure. Referring to FIG. 4A, a substrate 400, such as glass, quartz, plastic, or other array substrate material, is provided. The substrate 400 has a plurality of pixel regions (not shown) arranged in an array. In order to simplify the diagram, only a single pixel region is depicted. The substrate 400 has gate electrodes 401 and 403 adjacent and electrically connected to each other, in which the gate electrodes 401 and 403 are successively covered by a gate dielectric layer 402, a semiconductor layer 405, and a metal layer 408, in which the semiconductor layer 405 may comprise a non-doped semiconductor layer 404a and an overlying doped semiconductor layer 404b. The gate electrodes 401 and 403, the gate dielectric layer 402, the semiconductor layer 405, and the metal layer 408 can be formed by conventional deposition.

Next, a photoresist material 410 is coated onto the metal layer 408. The photoresist material 410 is subsequently exposed using a photomask. In the embodiment, in particular, the photoresist material 410 is exposed using the photomask 200 (as shown in FIGS. 1A and 1B) having various arrangements of light-shielding islands, as shown in FIGS. 2A to 2D.

Referring to 4B, a development process is performed on the exposed photoresist material 410 to form a photoresist pattern layer 412 with different thicknesses on the metal layer 408, in which the photoresist pattern layer 412 corresponding to the U-shaped channel-forming region 100a and the rectangular channel-forming region 100b have thicknesses d2 and d3, respectively, less than that of the photoresist pattern layer 412 corresponding to each pair of source/drain-forming region. In the embodiment, the translucent layer 102 of the photomask 200 has a first portion 104a covering the U-shaped channel-forming region 100a and has a second portion 104b covering the rectangular channel-forming region 100b. Since the plurality of light-shielding islands 110 is disposed within the rectangular channel-forming region 100b of the photomask 200, the difference in exposure degree between the U-shaped channel-forming region 100a and the rectangular channel-forming region 100b can be reduced when exposure is performed using the photomask 200, such that the thickness d2 of the photoresist pattern layer 412 corresponding to the U-shaped channel-forming region 100a is substantially the same as the thickness d3 of the photoresist pattern layer 412 corresponding to the rectangular channel-forming region 100b.

Referring to FIG. 4C, the metal layer 408 is etched using the photoresist pattern layer 412 as an etch mask, to form a pair of source/drain electrodes 414a on the gate electrode 401 and a pair of source/drain electrodes 414b on the gate electrode 403. However, it is required that an oxygen-plasma etching process is performed on the photoresist pattern layer 412 prior to etch of the metal layer 408. If the thickness d2 of the photoresist pattern layer 412 is greater than the thickness d3 of the photoresist pattern layer 412, the photoresist pattern layer 412 corresponding to the rectangular channel-forming region 100b is firstly removed, such that the surface of the metal layer 408 thereunder is exposed and oxidized. The oxidized metal layer 408 causes incomplete etching, resulting in short circuit of a resulting TFT, thereby reducing TFT fabrication yield. According to the embodiment, since the thickness d2 of the photoresist pattern layer 412 corresponding to the U-shaped channel-forming region 100a is substantially the same as the thickness d3 of the photoresist pattern layer 412 corresponding to the rectangular channel-forming region 100b, the incompletely etching problem is eliminated, thereby increasing TFT fabrication yield or maintaining TFT fabrication yield.

Figure 3A:
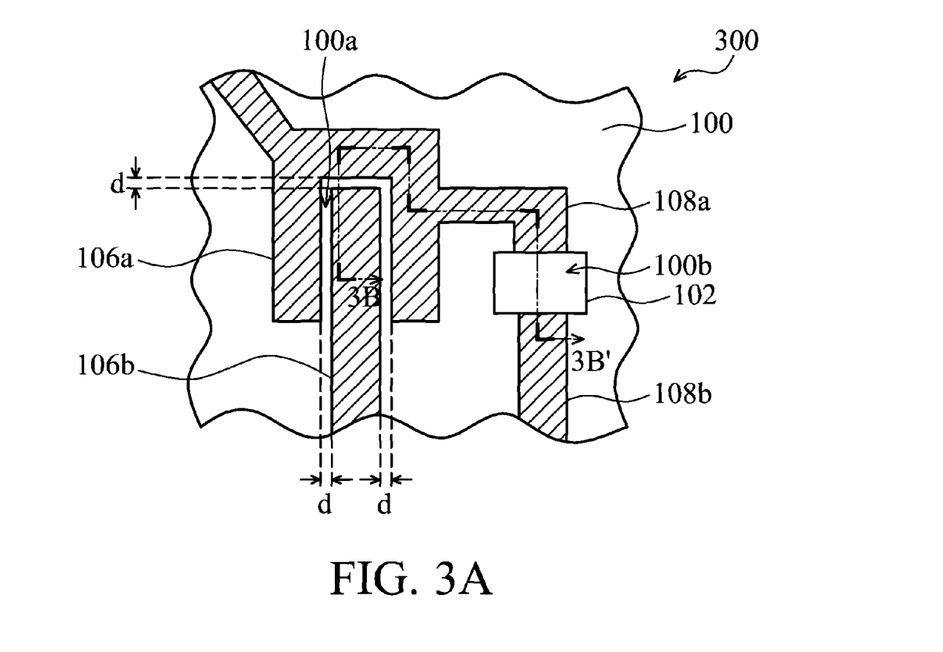
FIG. 3A is a plan view of another embodiment of a photomask according to the disclosure.
Figure 3B:
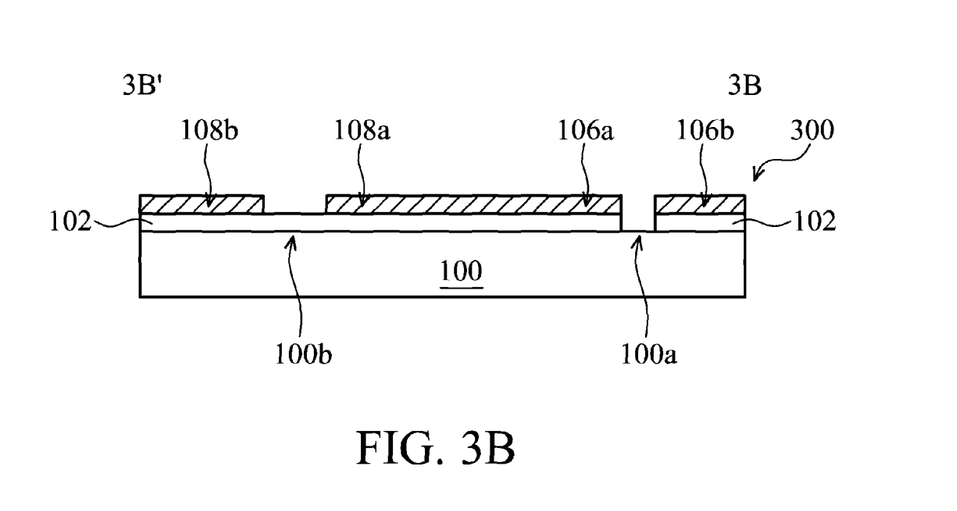
FIG. 3B is a cross section along the line 3B-3B' shown in FIG. 3A.

FIGS. 3A and 3B illustrate another embodiment of a photomask according to the disclosure, in which FIG. 3B is a cross section along the line 3B-3B' shown in FIG. 3A. Elements in FIGS. 3A and 3B that are the same as those in FIGS. 1A and 1B are labeled with the same reference numbers as in FIGS. 1A and 1B and are not described again for brevity. Unlike the embodiment of FIGS. 1A and 1B, the translucent layer 102 of the photomask 300 is disposed on the transparent substrate 100, covering the rectangular channel-forming region 100b, and exposing the U-shaped channel-forming region 100a, in which the translucent layer 102 has a transmittance of about 30% to 35%. Moreover, a slit is formed between the light-shielding layers 106a and 106b, and the slit width d (i.e. the space between the light-shielding layers 106a and 106b) is the same as the width of the U-shaped channel-forming region 100a (i.e. the distance between the source and drain electrodes corresponding to the U-shaped channel-forming region 100a), in which the slit width/space d is about 1.7 μm to 2.5 μm. In some embodiments, the light-shielding islands 110, 112, and 114 within the rectangular channel-forming region 100b also have various arrangements, as shown in FIGS. 2A to 2D. In the embodiment, the exposure degree of the rectangular channel-forming region 100b can be substantially the same as that of the U-shaped channel-forming region 100a by forming a slit between the light-shielding layers 106a and 106b and adjusting the transmittance of the translucent layer corresponding to the rectangular channel-forming region 100b.

Figure 5A:
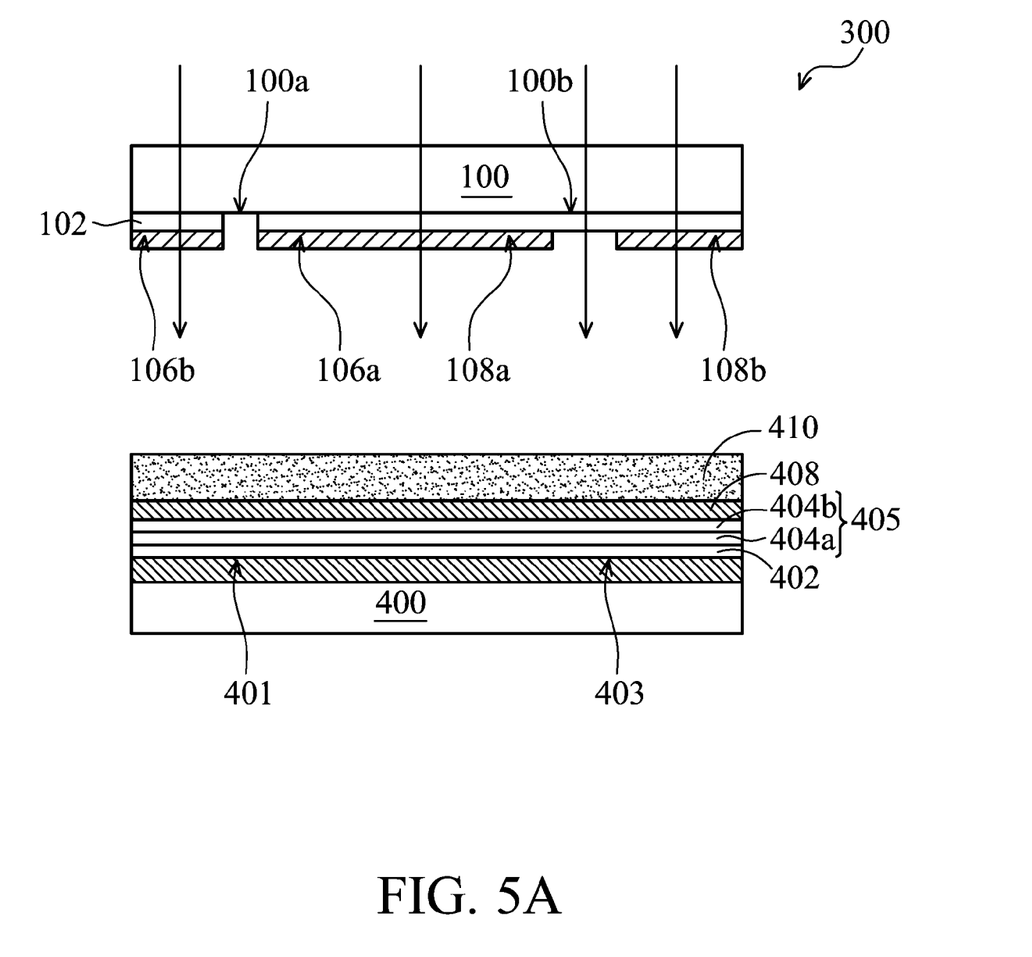
FIGS. 5A to 5C are cross sections of another embodiment of a method for fabricating source/drain electrodes of a TFT according to the disclosure.
Figure 5B:
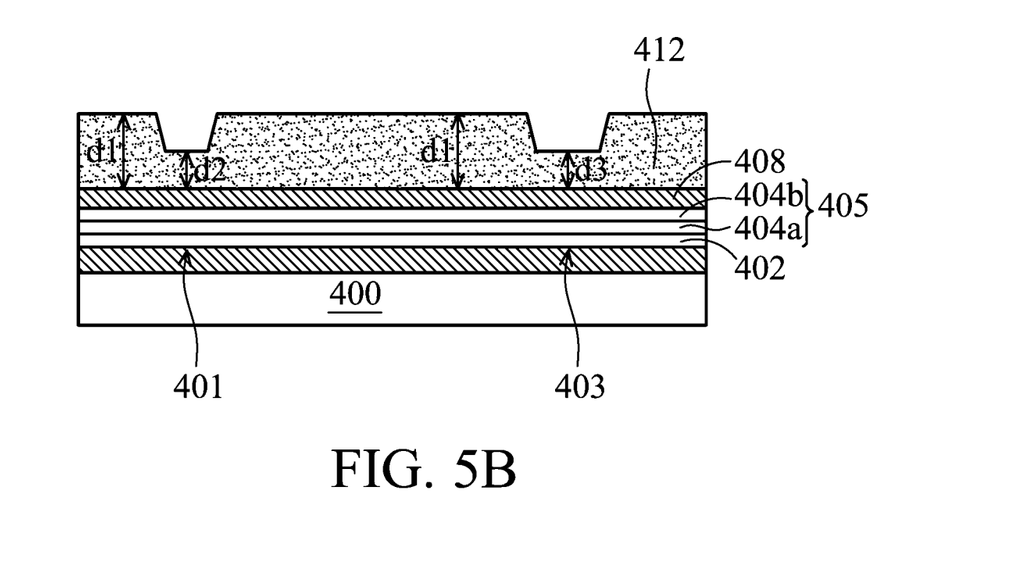
Figure 5C:
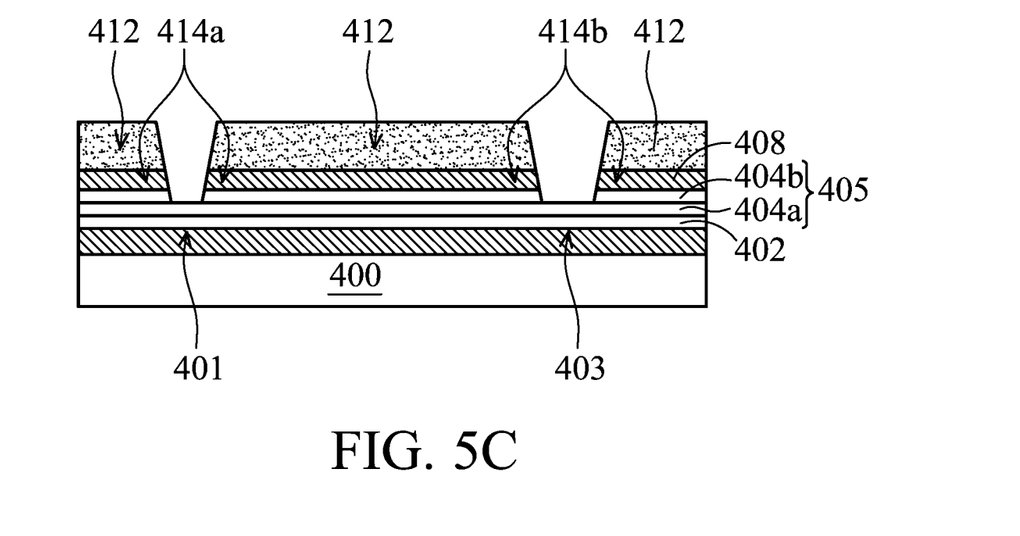

FIGS. 5A to 5C are cross sections of another embodiment of a method for fabricating source/drain electrodes of a TFT according to the disclosure. Elements in FIGS. 5A to 5C that are the same as those in FIGS. 4A to 4C are labeled with the same reference numbers as in FIGS. 4A to 4C and are not described again for brevity. Referring to FIG. 5A, a substrate 400 is provided. The substrate 400 has gate electrodes 401 and 403 adjacent and electrically connected to each other, in which the gate electrodes 401 and 403 are successively covered by a gate dielectric layer 402, a semiconductor layer 405, and a metal layer 408, in which the semiconductor layer 405 may comprise a non-doped semiconductor layer 404a and an overlying doped semiconductor layer 404b.

Next, a photoresist material 410 is coated onto the metal layer 408. The photoresist material 410 is subsequently exposed using a photomask 300, in which the photomask 300 has various arrangements of light-shielding islands, as shown in FIGS. 2A to 2D.

Referring to 5B, a development process is performed on the exposed photoresist material 410 to form a photoresist pattern layer 412 with different thicknesses on the metal layer 408, in which the photoresist pattern layer 412 corresponding to the U-shaped channel-forming region 100a and the rectangular channel-forming region 100b have thicknesses d2 and d3, respectively, less than that of the photoresist pattern layer 412 corresponding to each pair of source/drain-forming region. In the embodiment, the translucent layer 102 of the photomask 300 is disposed on the transparent substrate 100, covers the rectangular channel-forming region 100b, and exposes the U-shaped channel-forming region 100a. Since the transmittance of the translucent layer 102 corresponding to the rectangular channel-forming region 100b is about 30% to 35%, and the slit width between the light-shielding layers 106a and 106b is about 1.7 μm to 2.5 μm, the difference in exposure degree between the U-shaped channel-forming region 100a and the rectangular channel-forming region 100b can be reduced when exposure is performed using the photomask 300, such that the thickness d2 of the photoresist pattern layer 412 corresponding to the U-shaped channel-forming region 100a is substantially the same as the thickness d3 of the photoresist pattern layer 412 corresponding to the rectangular channel-forming region 100b. Additionally, the light-shielding islands 110, 112, and 114 arranged within the rectangular channel-forming region 100b of the photomask 300 (as shown in FIGS. 2A to 2D) can also reduce the difference in exposure degree between the U-shaped channel-forming region 100a and the rectangular channel-forming region 100b.

Referring to FIG. 5C, the metal layer 408 is etched using the photoresist pattern layer 412 as an etch mask, to form a pair of source/drain electrodes 414a on the gate electrode 401 and a pair of source/drain electrodes 414b on the gate electrode 403. According to the embodiment, since the thickness d2 of the photoresist pattern layer 412 corresponding to the U-shaped channel-forming region 100a is substantially the same as the thickness d3 of the photoresist pattern layer 412 corresponding to the rectangular channel-forming region 100b, the incomplete etching problem is eliminated, thereby increasing TFT fabrication yield or maintaining TFT fabrication yield.

While the disclosure has been described by way of example and in terms of preferred embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating source/drain electrodes of a thin film transistor, comprising:
   providing a substrate having a first gate electrode and a second gate electrode adjacent and electrically connected thereto, wherein the first and second gate electrodes are successively covered by a gate dielectric layer, a semiconductor layer, and a metal layer;
   coating a photoresist layer on the metal layer;
   performing an exposure process on the photoresist layer by a photomask comprising:
      a transparent substrate having a U-shaped channel-forming region and a rectangular channel-forming region corresponding to the first and second gate electrodes, respectively;
      a translucent layer disposed on the transparent substrate and covering the U-shaped and rectangular channel-forming regions;
      a first light-shielding layer and a second light-shielding layer disposed on the translucent layer and located at the outer and inner sides of the U-shaped channel-forming region, respectively, to serve as a pair of first source/drain-forming regions;
      a third light-shielding layer and a fourth light-shielding layer disposed on the translucent layer and located at opposite sides of the rectangular channel-forming region, respectively, to serve as a pair of second source/drain-forming regions, wherein an end of the third light-shielding layer extends to the first light-shielding layer; and
      a plurality of first light-shielding islands disposed on the translucent layer and located within the rectangular channel-forming region;
   performing a development process on the exposed photoresist layer to form a photoresist pattern layer with different thicknesses on the metal layer, wherein the photoresist pattern layer corresponding to the U-shaped and rectangular channel-forming regions has a thickness less than that of the photoresist pattern layer corresponding to the pairs of first and second source/drain-forming regions; and etching the metal layer using the photoresist pattern layer as an etch mask, to form a pair of first source/drain electrodes on the first gate electrode and a pair of second source/drain electrodes on the second gate electrode.

2. The method of claim 1, wherein the photoresist pattern layer corresponding to the U-shaped channel-forming region has a thickness substantially the same as that of the photoresist pattern layer corresponding to the rectangular channel-forming region.

3. The method of claim 1, wherein the plurality of first light-shielding islands is arranged in parallel from each other by a predetermined space, and there is a predetermined distance between each first light-shielding island and the third or fourth light-shielding layer, wherein the ratio of the predetermined distance to the predetermined space between the plurality of first light-shielding islands is about 1.25 to 1.5.

4. The method of claim 3, wherein the predetermined space is about 2.0 μm to 2.5 μm.

5. The method of claim 1, wherein the photomask further comprises a plurality of second light-shielding islands disposed on the translucent layer, located within the rectangular channel-forming region, and arranged in parallel with the plurality of first light-shielding islands.

6. The method of claim 5, wherein the photomask further comprises a pair of third light-shielding islands disposed on the translucent layer and located within the rectangular channel-forming region and at opposite sides thereof, such that the pluralities of first and second light-shielding islands are located between the pair of third light-shielding islands.

7. The method of claim 1, wherein the photomask further comprises a pair of second light-shielding islands disposed on the translucent layer and located within the rectangular channel-forming region and at opposite sides thereof, such that the plurality of first light-shielding islands is located between the pair of second light-shielding islands.

8. The method of claim 7, wherein each first light-shielding island and each second light-shielding island have a rectangular profile from a top view, wherein each second light-shielding island has a width of about 0.7 μm to 1.0 μm and has a length greater than that of each first light-shielding island.

9. A method for fabricating source/drain electrodes of a thin film transistor, comprising:

providing a substrate having a first gate electrode and a second gate electrode adjacent and electrically connected thereto, wherein the first and second gate electrodes are successively covered by a gate dielectric layer, a semiconductor layer, and a metal layer;

coating a photoresist layer on the metal layer;

performing an exposure process on the photoresist layer by a photomask comprising:

a transparent substrate having a U-shaped channel-forming region and a rectangular channel-forming region corresponding to the first and second gate electrodes, respectively;

a translucent layer disposed on the transparent substrate, covering the rectangular channel-forming region, and exposing the U-shaped rectangular channel-forming region, wherein the translucent layer has a transmittance of about 30% to 35%;

a first light-shielding layer and a second light-shielding layer disposed on the translucent layer and located at the outer and inner sides of the U-shaped channel-forming region, respectively, to serve as a pair of first source/drain-forming regions, wherein a space between the first and second light-shielding layers is the same as a width of the U-shaped channel-forming region, and the space is about 1.7 μm to 2.5 μm; and a third light-shielding layer and a fourth light-shielding layer disposed on the translucent layer and located at opposite sides of the rectangular channel-forming region, respectively, to serve as a pair of second source/drain-forming regions, wherein an end of the third light-shielding layer extends to the first light-shielding layer;

performing a development process on the exposed photoresist layer to form a photoresist pattern layer with different thicknesses on the metal layer, wherein the photoresist pattern layer corresponding to the U-shaped and rectangular channel-forming regions has a thickness less than that of the photoresist pattern layer corresponding to the pairs of first and second source/drain-forming regions; and etching the metal layer using the photoresist pattern layer as an etch mask, to form a pair of first source/drain electrodes on the first gate electrode and a pair of second source/drain electrodes on the second gate electrode.

10. The method of claim 9, wherein the photoresist pattern layer corresponding to the U-shaped channel-forming region has a thickness substantially the same as that of the photoresist pattern layer corresponding to the rectangular channel-forming region.

11. The method of claim 9, wherein the photomask further comprises a plurality of first light-shielding islands disposed on the translucent layer and located within the rectangular channel-forming region.

12. The method of claim 11 wherein the plurality of first light-shielding islands is arranged in a line by a predetermined space, and there is a predetermined distance between each first light-shielding island and the third or fourth light-shielding layer, wherein the ratio of the predetermined distance to the predetermined space between the plurality of first light-shielding islands is about 1.25 to 1.5.

13. The method of claim 12, wherein the predetermined space is about 2.0 μm to 2.5 μm.

14. The method of claim 11, wherein the photomask further comprises a plurality of second light-shielding islands disposed on the translucent layer, located within the rectangular channel-forming region, and arranged in parallel with the plurality of first light-shielding islands.

15. The method of claim 14, wherein the photomask further comprises a pair of third light-shielding islands disposed on the translucent layer and located within the rectangular channel-forming region and at opposite sides thereof, such that the plurality of first and second light-shielding islands are located between the pair of third light-shielding islands.

16. The method of claim 11, wherein the photomask further comprises a pair of second light-shielding islands disposed on the translucent layer and located within the rectangular channel-forming region and at opposite sides thereof, such that the plurality of first light-shielding islands is located between the pair of second light-shielding islands.

17. The method of claim 16, wherein each first light-shielding island and each second light-shielding island have a rectangular profile from a top view, wherein each second light-shielding island has a width of about 0.7 μm to 1.0 μm and has a length greater than that of each first light-shielding island.

* * * * *